United States Patent [19]
Yeh et al.

[11] Patent Number: 5,862,078
[45] Date of Patent: *Jan. 19, 1999

[54] MIXED MODE ERASE METHOD TO IMPROVE FLASH EEPROM WRITE/ERASE THRESHOLD CLOSURE

[75] Inventors: Juang-Ker Yeh; Jian-Hsing Lee, both of Hsin-Chu; Kuo-Reay Peng, Kuoshung; Ming-Chou Ho, Taichung, all of Taiwan

[73] Assignee: Taiwan Semiconductor Manufacturing Company, Ltd., Hsin-Chu, Taiwan

[ * ] Notice: The term of this patent shall not extend beyond the expiration date of Pat. No. 5,838,618.

[21] Appl. No.: 907,984

[22] Filed: Aug. 11, 1997

[51] Int. Cl.$^6$ .................................................. G11C 16/04
[52] U.S. Cl. .............................. 365/185.29; 365/185.19; 365/185.26; 365/185.27
[58] Field of Search ........................ 368/185.29, 185.33, 368/185.26, 185.27, 185.19

[56] References Cited

U.S. PATENT DOCUMENTS

| | | | |
|---|---|---|---|
| 5,243,559 | 9/1993 | Murai ................................. | 365/185.27 |
| 5,361,235 | 11/1994 | Kodama ............................. | 365/185.19 |
| 5,457,652 | 10/1995 | Brahmbhatt ....................... | 365/185.06 |
| 5,481,494 | 1/1996 | Tang et al. ......................... | 365/185.24 |
| 5,485,423 | 1/1996 | Tang et al. ............................... | 365/185 |
| 5,521,866 | 5/1996 | Akaogi ............................... | 365/185.29 |
| 5,596,528 | 1/1997 | Raya et al. ......................... | 365/185.24 |

*Primary Examiner*—David Nelms
*Assistant Examiner*—Hoai V. Ho
*Attorney, Agent, or Firm*—George O. Saile; Stephen B. Ackerman; Bill Knowles

[57] ABSTRACT

A method to erase data from a flash EEPROM while electrical charges trapped in the tunneling oxide of a flash EEPROM are eliminated to maintain proper separation of the programmed threshold voltage and the erased threshold voltage after extended programming and erasing cycles. The method to erase a flash EEPROM cell begins by channel erasing to detrap the tunneling oxide of the flash EEPROM cell. The channel erasing consists floating the drain and the second diffusion well and concurrently applying the ground reference potential to the semiconductor substrate and the first diffusion well. Concurrently a first relatively large negative voltage pulse is applied to the control gate, as a first moderately large positive voltage pulse is applied to said source. The method to erase then proceeds with the source erasing to remove charges from the floating gate of the flash EEPROM cell. The source erasing consists of applying a second relatively large negative voltage pulse to the control gate of said EEPROM cell and concurrently applying a second moderately large positive voltage pulse to a first diffusion well. At the same time the ground reference potential continues to be applied to the semiconductor substrate, while the drain and a second diffusion well is allowed to float.

22 Claims, 7 Drawing Sheets

MIXED MODE ERASE METHOD TO IMPROVE FLASH EEPROM WRITE/ERASE THRESHOLD CLOSURE

BACKGROUND OF THE INVENTION

RELATED PATENT APPLICATIONS

Attorney's Docket Number TSMC97-125, "A Novel Method To Improve Flash EEPROM Write/Erase Threshold Closure," Ser. No.: 08/928,217, Filing Date: Sep. 12, 1997, assigned to the Same Assignee as the present invention.

Attorney's Docket Number TSMC97-126, "A Novel Method to Erase A Flash EEPROM Using Negative Gate Source Erase Followed By a High Negative Gate Erase," Ser. No.: 08/928,127, Filing Date: Sep. 12, 1997, assigned to the Same Assignee as the present invention.

Attorney's Docket Number TSMC97-085, "A Bi-Modal Erase Method For Eliminating Cycling-induced Flash EEPROM Cell Write/Erase Threshold Closure," Ser. No.: 08/927,472, Filing Date: Sep. 11, 1997, assigned to the Same Assignee as the present invention.

Attorney's Docket Number TSMC97-099, "A Novel Erase Method Of Flash EEPROM By Using Snapback Characteristic," Ser. No.: 08/957,678, Filing Date: Oct. 24, 1997, assigned to the Same Assignee as the present invention.

1. Field of the Invention

This invention relates generally to a class of non-volatile memory devices referred to as flash electrically erasable programmable read-only memory (flash EEPROM). More particularly, this invention relates to methods and means to erase digital data from a flash EEPROM cell and for eliminating trapped charges from the flash EEPROM cell.

2. Description of Related Art

Figure 1A:
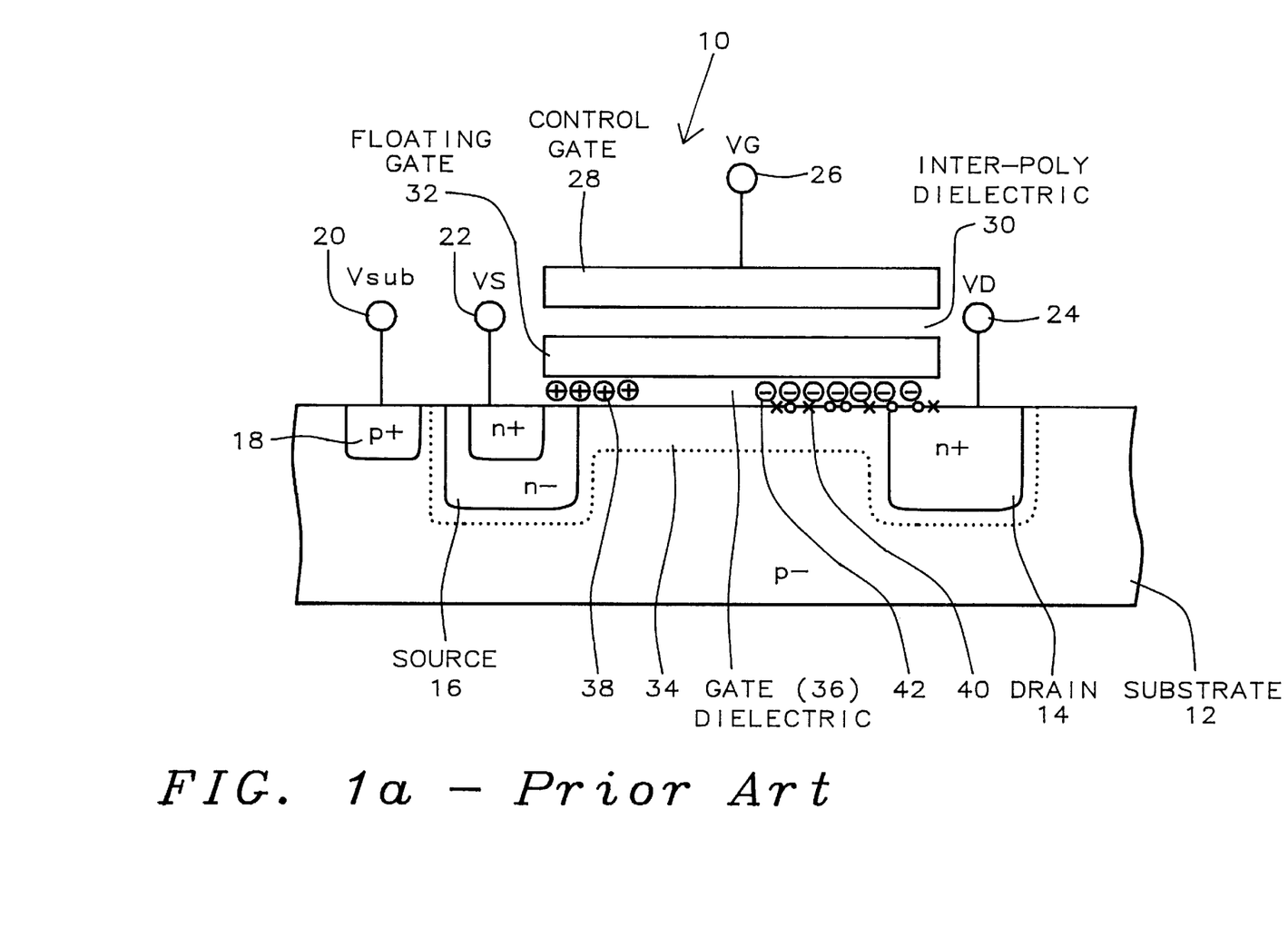
FIGS. 1a and 1b are cross-sectional views of flash EEPROM's of the prior art.

The structure and application of the flash EEPROM is well known in the art. The Flash EEPROM provides the density advantages of an erasable programmable read-only memory (EPROM) that employs ultra-violet light to eliminate the programming with the speed of a standard EEPROM. FIG. 1a illustrates a cross-sectional view of a flash EEPROM cell of the prior art. The flash EEPROM cell 10 is formed within a p-type substrate 12. An $n^+$ drain region 14 and an $n^+$ source region 16 is formed within the p-type substrate 12.

A relatively thin gate dielectric 36 is deposited on the surface of the p-type substrate 12. The thin gate dielectric 36 will also be referred to as a tunneling oxide, hereinafter. A poly-crystalline silicon floating gate 32 is formed on the surface of the gate dielectric 36 above the channel region 34 between the drain region 14 and source region 16. An interpoly dielectric layer 30 is placed on the floating gate 32 to separate the floating gate 32 from a second layer of poly-crystalline silicon that forms a control gate 28.

A $p^+$ diffusion 18 is placed in the p-type substrate 12 to provide a low resistance path from a terminal 20 to the p-type substrate. The terminal 20 will be attached to a substrate voltage generator Vsub. In most application of an EEPROM, the substrate voltage generator Vsub will be set to the ground reference potential (0 V).

The source region 16 will be connected to a source voltage generator VS through the terminal 22. The control gate 28 will be connected through the terminal 26 to the control gate voltage generator VG. And the drain region 14 will be connected through the terminal 24 to the drain voltage generator VD.

According to conventional operation, the flash EEPROM cell 10 is programmed by setting the gate control voltage generator VG to a relatively high voltage (on the order of 10 V). The drain voltage generator VD is set to a moderately high voltage (on the order of 5 V), while the source voltage generator VS is set to the ground reference potential (0 V).

With the voltages as described above, hot electrons will be produced in the channel 34 near the drain region 14. These hot electrons will have sufficient energy to be accelerated across the gate dielectric 36 and trapped on the floating gate 32. The trapped hot electrons will cause the threshold voltage of the field effect transistor (FET) that is formed by the flash EEPROM cell 10 to be increased by three to five volts. This change in threshold voltage by the trapped hot electrons causes the cell to be programmed.

During the programming process some of the hot electrons will be trapped 42 in the tunneling oxide 36 or in surface states 40 at the surface of the p-type substrate 12. These trapped electrons will cause the threshold voltage of the erased flash EEPROM cell 10 to increase.

Figure 2A:
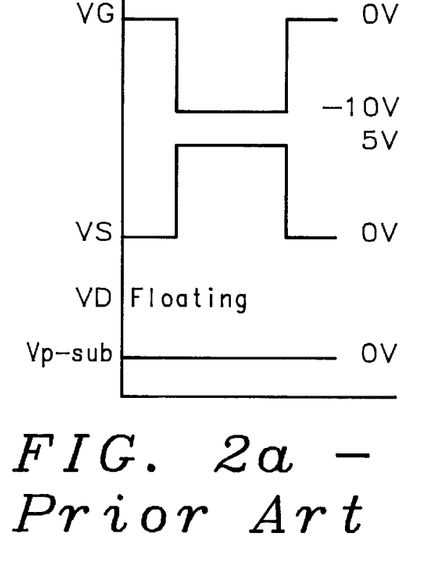
FIGS. 2a and 2b are timing diagrams of erase cycles of the flash EEPROM of the prior art.

To erase the flash EEPROM cell 10 as described in U.S. Pat. No. 5,481,494(Tang et al.), as shown in FIG. 2a, a moderately high positive voltage (on the order of 5 V) is generated by the source voltage generator VS. Concurrently, the gate control voltage generator VG is set to a relatively large negative voltage (on the order of −10 V). The substrate voltage generator VS are set to the ground reference potential. The drain voltage generator VD is usually disconnected from the terminal 24 to allow the drain region 14 to float. Under these conditions there is a large electric field developed across the tunneling oxide 36 in the source region 16. This field causes the electrons trapped in the floating gate 32 to flow to portion of the floating gate 32 that overlaps the source region 16. The electrons are then extracted to the source region 16 by the Fowler-Nordheim tunneling.

Further Tang et al. shows a method for tightening the threshold voltage VT distribution of an array of flash EEPROM cells. The moderately high positive voltage (5 V) that is applied to the source regions of the array of flash EEPROM cells and the relatively large negative voltage that is applied to the control gate insure a tighter distribution of the thresholds of the array of cells. The value of a load resistor between the low positive voltage and the source region is simultaneously reduced to a predetermined value so as to compensate for the increased erase time caused by the lowering of the magnitude of the negative constant voltage.

Referring back to FIG. 1a during the erasure process, some positive charges 38 will be forced and trapped in the tunneling oxide 36. These trapped positive charges 38 will cause the threshold voltage of the programmed flash EEPROM cell 10 to decrease. As can be shown in FIG. 3a, after repeatedly performing write/erase cycling, the combination of the decrease 52 in the programmed threshold voltage 50 and the increase 57 in the erased threshold voltage 55 will cause the separation of the programmed threshold voltage 50 and the erased threshold voltage 55 to close until the flash EEPROM cell 10 fails. At this time the flash EEPROM will no longer be able to operate reliably to store digital data.

Figure 3A:
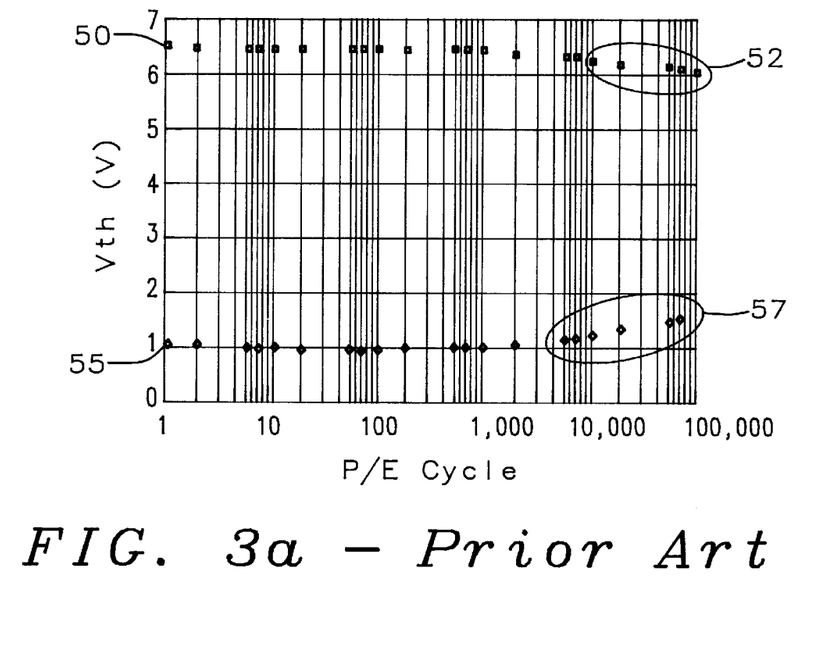
Figure 3B:
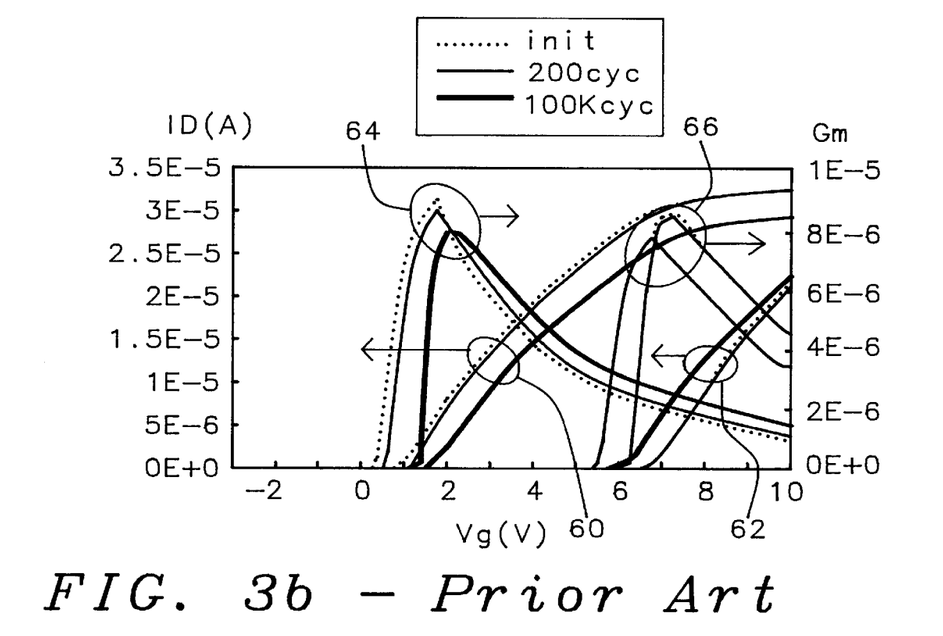
FIG. 3b is plot of the drain current $I_d$ and transconductance $G_m$ versus control gate voltage $V_g$ for an EEPROM cell employing the erase cycle of the prior art.

Another illustration of the impact of the trapped charges is shown in FIG. 3b. FIG. 3b shows the drain current $I_d$ versus the voltage $V_g$ at the control gate for the cell of FIG. 1b. The set of curves 60 are for a cell that has been erased, while the set of curves 62 are for a cell that has been programmed. As can be seen, after 100K cycles of writing and erasing, the drain current $I_d$ will decrease for a given control gate voltage $V_g$. Further FIG. 3b shows the change of transconductance $G_m$ versus the voltage $V_g$ at the control gate for the cell of FIG. 1b. The set of curves 64 are for a cell that has been erased and the set of curves 66 are for a cell that has been written. Again, as can been seen, having been exposed to 100k cycles of writing and erasing will cause the transconductance $G_m$ to shift for a given control gate voltage $V_g$.

Figure 2B:
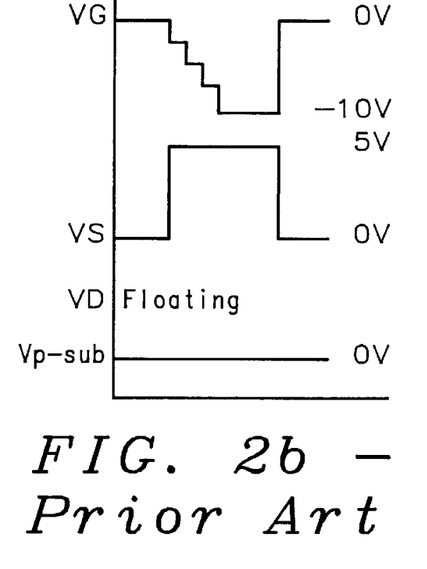

U.S. Pat. No. 5,485,423 (Tang et al.) as shown in FIG. 2b, describes a method of erasure of a flash EEPROM. A moderately large positive voltage pulse is generated by the source voltage generator VS. Simultaneously, a negative ramp voltage is developed by the gate control voltage generator VD. The drain voltage generator VG will be disconnected from the drain to allow the drain to float and the substrate voltage generator will be set to the ground reference potential as above described. This method will achieve an averaging of the tunneling field during the entire erase cycle.

Figure 1B:
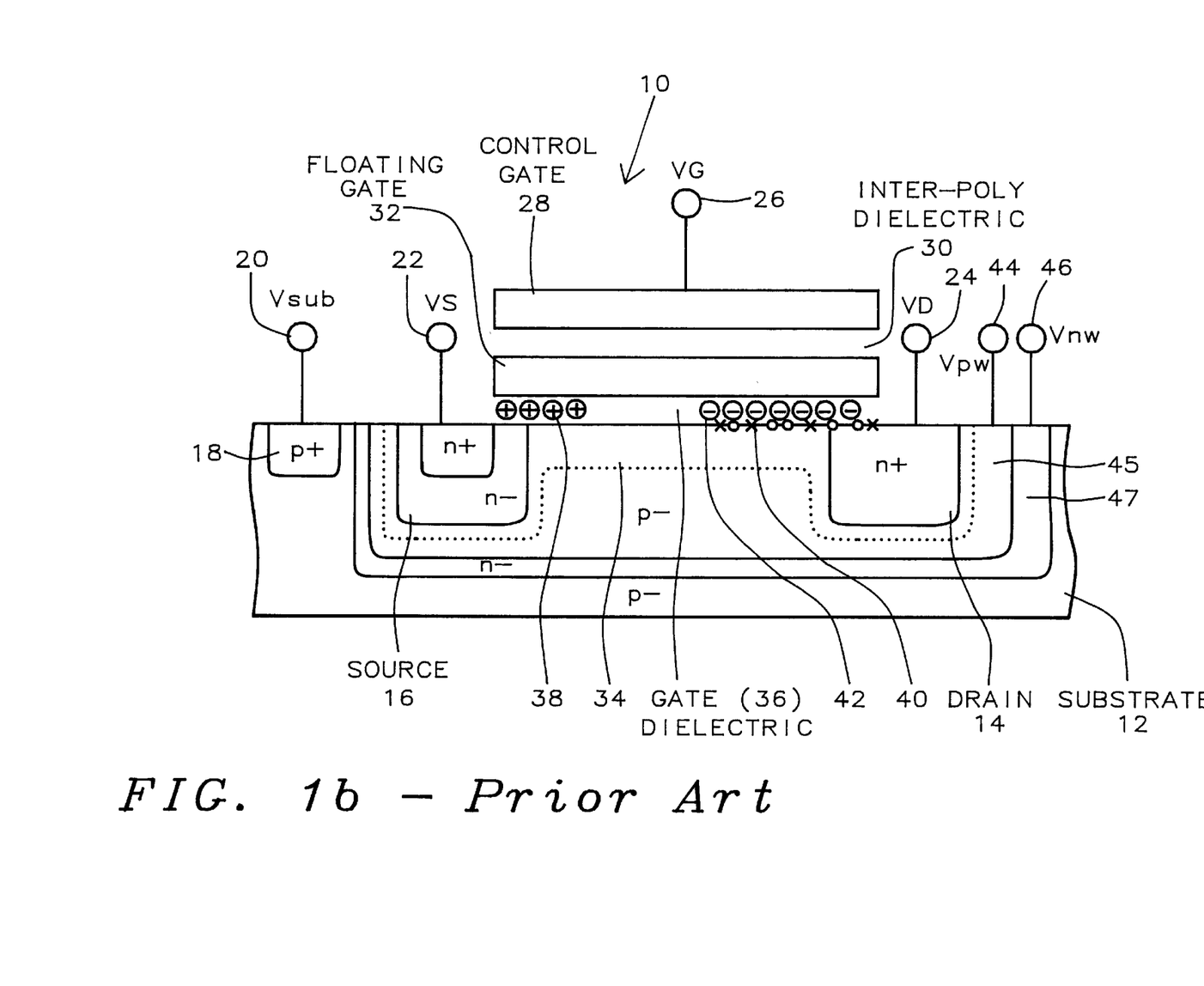

U.S. Pat. No. 5,521,866 (Akaogi) and as shown in FIG. 1b describes non volatile semiconductor memory device having a floating gate 30. The memory device is constructed with a n-well 47 diffused into the semiconductor substrate 12 and a p-well 45 diffused into the n-well 47. The source 18 and drain 14 are then diffused into the p-well 45 with a floating gate 30 and control gate 28 disposed on the surface of the semiconductor substrate much as described in FIG. 1. The erasure process involves applying a positive voltage to p-well 45 and the n-well 47.

U.S. Pat. No. 5,596,528 (Kaya et al.) describes a method to program a flash EEPROM array will provide a narrow distribution of threshold voltage. The method eliminates the drain-column line loading effect and overcomes word line stress approach because high voltages are eliminated from the wordlines. The gate compaction is accomplished by reverse biasing the source and the substrate. This limits the channel currents in individual cells. If a cell loses its charge it will be restored by this method.

SUMMARY OF THE INVENTION

An object of this invention is to provide a method for the erasure of data from a flash EEPROM.

Another object of this invention is to provide a method to eliminate electrical charges trapped in the tunneling oxide and within surface states at the interface of the semiconductor substrate.

Further another object of this invention is to eliminate electrical charges trapped in the tunneling oxide of a flash EEPROM to maintain proper separation of the programmed threshold voltage and the erased threshold voltage after extended programming and erasing cycles.

To accomplish these and other objects a method to erase a flash EEPROM cell begins by channel erasing to detrap the flash EEPROM cell. The channel erasing consists floating the drain and the second diffusion well and concurrently applying the ground reference potential to the semiconductor substrate and the first diffusion well. Concurrently a first relatively large negative voltage pulse is applied to the control gate, as a first moderately large positive voltage pulse is applied to said source. The method to erase then proceeds with the source erasing to remove charges from the floating gate of the flash EEPROM cell. The source erasing consists of applying a second relatively large negative voltage pulse to the control gate of said EEPROM cell and concurrently applying a second moderately large positive voltage pulse to a first diffusion well. At the same time the ground reference potential continues to be applied to the semiconductor substrate, while the drain and a second diffusion well is allowed to float.

BRIEF DESCRIPTION OF THE DRAWINGS

FIG. 3a is a plot of the threshold voltages versus the number of programming and erasing cycles, using the erasing cycle of the prior art, as shown in FIG. 2a.

DETAILED DESCRIPTION OF THE INVENTION

Figure 4:
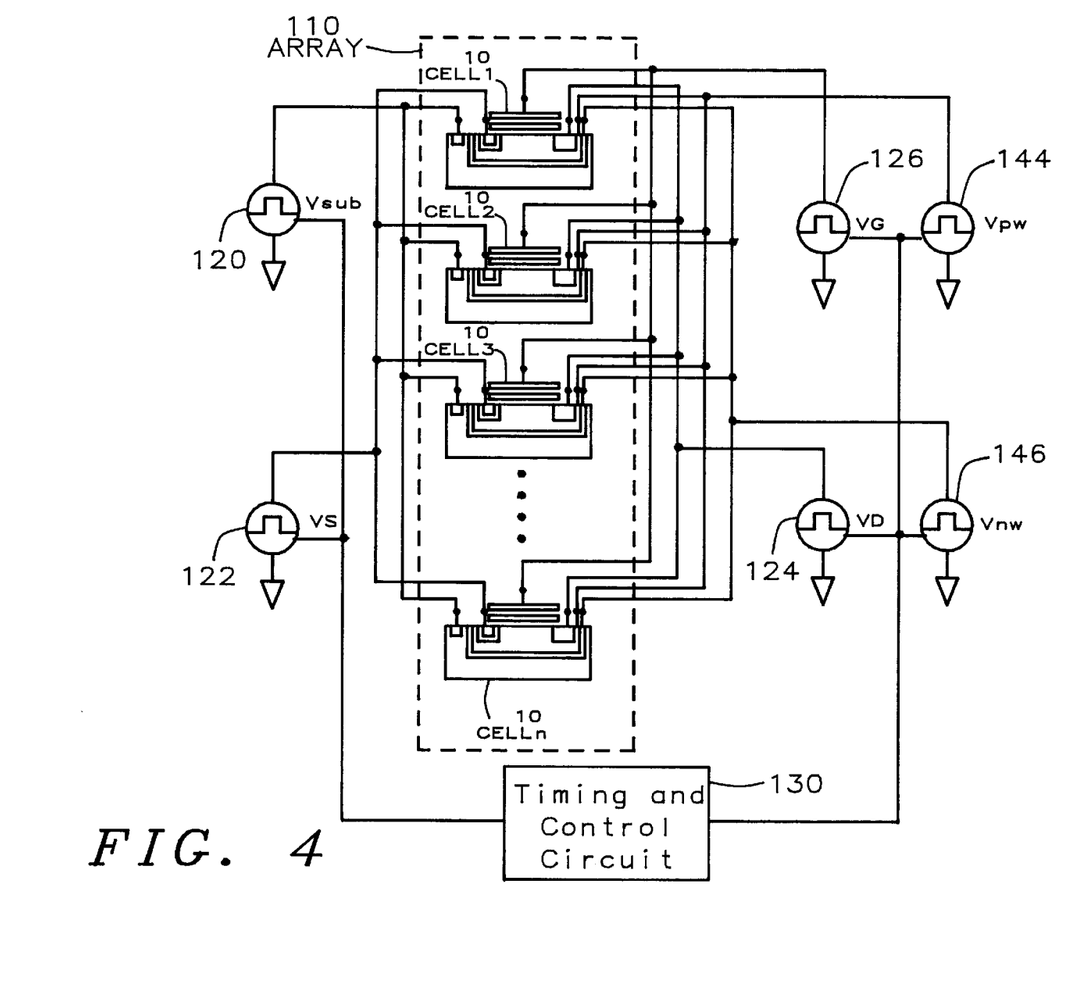
FIG. 4 is an array of flash EEPROM cells showing the connections of the voltage generators of this invention.

Referring now to FIG. 4, an array 110 of flash EEPROM cells 10 are disposed upon a common substrate. For convenience of design, the cells Cell1, Cell2, Cell3, . . . , Celln will be formed into rows and column. The array will have auxiliary circuitry (not shown) that will address either the individual cells Cell1, Cell2, Cell3, . . . , Celln or groups of cells for reading from the cells or for writing or programming the cells. The writing or programming procedures will as described for the flash EEPROM cell of FIG. 1a.

The connection for the substrate voltage generator Vsub 120 will be connected through the terminal 20 to the p-type substrate. The connection of the source voltage generator VS 122 to the source region is through the terminal 22. The connection of the drain voltage generator VD 124 to the drain region is through terminal 24. The connection of the gate control voltage generator VG 126 to the control gate is through the terminal 26. The p-well voltage generator Vpw 144 and the n-well voltage generator Vnw 146 will be connected respectively to the p-well 45 and the n-well 47 through terminals 44 and 46. The timing and control circuitry 130 in conjunction with the auxiliary circuitry (not shown) will determine the voltages and timings for the substrate voltage generator Vsub 120, the source voltage generator VS 122, the drain voltage generator VD 124, the gate control voltage generator VG 126 the p-well voltage generator Vpw 144, and the n-well voltage generator Vnw 146.

Figure 5:
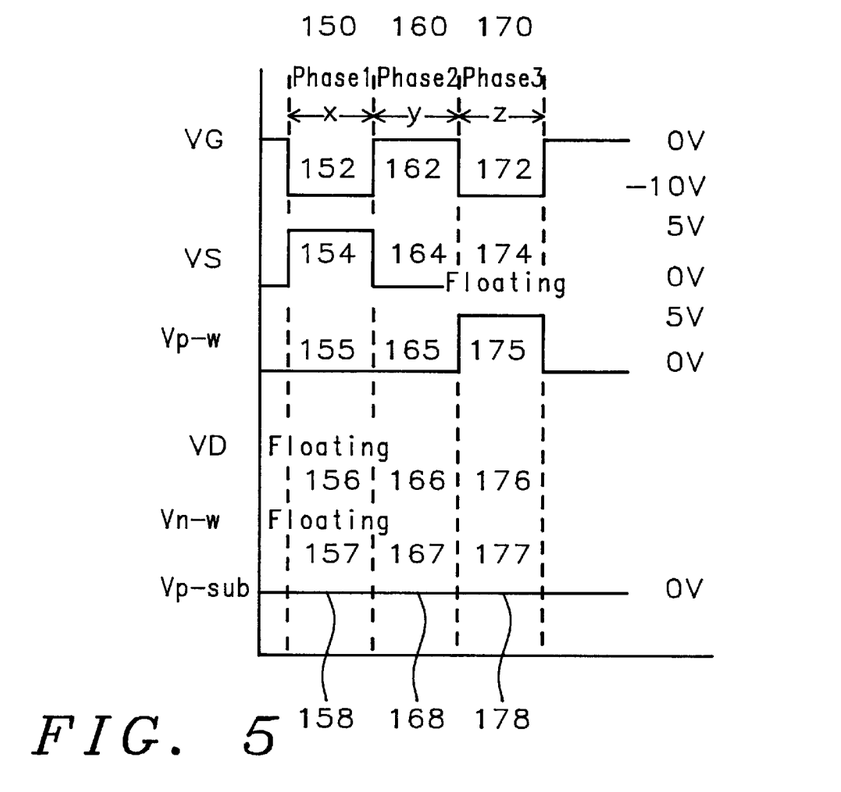
FIG. 5 is timing diagram of an erase cycle of a flash EEPROM of this invention.

Refer now to FIGS. 1b, 4, and 5 to understand the erase cycle of this invention. The initial period of the erase cycle (phase 1) or channel erase phase 150 starts by the gate control voltage generator VG 126 being brought to a first relatively large negative voltage (−10 V) 152. Concurrently, the source voltage generator VS 122 is set to a second moderately large voltage (5 V) to bring the source region 16 to the second moderately large voltage (5 V) 154. At this time, the substrate voltage generator Vsub 120 and thus the p-type substrate 12 will be set at the ground reference potential (0 V) 158. While the drain voltage generator VD 124 will be disconnected from the drain region 14 to maintain the drain region 14 at a floating condition 156, and the n-well voltage generator Vnw 146 will be disconnected from the n-well 47 to have the n-well 47 floating 157.

A second phase (phase 2) 160 will terminate the channel erase cycle by bringing the source voltage generator VS 122, the p-well voltage generator Vpw 144 and the gate control voltage generator VG 126 to the ground reference potential (0 V) 162, 164 and 165. The substrate voltage generator Vsub 120 will remain at the ground reference potential (0 V) 168. The drain voltage generator VD 124 will remain disconnected from the drain region 24 to keep the drain region 24 floating 166, and the n-well voltage generator Vnw 146 will remain disconnected from the n-well 47 to keep the n-well 47 floating 167.

Having terminated the channel erase phase 150 in phase 2 160, the source erase phase (phase 3) can begin by setting the gate control voltage generator VG 126 and thus the control gate, again, to a first relatively large negative voltage (−10 V) 172. The source voltage generator VS 122 will be disconnected from the source region 16 to allow the source region 16 to be floating 174. The p-well voltage generator Vpw 144 and thus the p-well 45 will be set to a second moderately high voltage (5 V) 175. The n-well voltage generator Vnw 146 will remain disconnected from the n-well 47 to allow the n-well 47 to remain floating 177. The drain voltage generator VD 124 remain disconnected from the drain region 14 such that it will remain floating 176. The substrate voltage generator Vsub 120 and thus the p-type substrate 12 continues to be set to the ground reference potential (0 V) 178.

The voltages as described for the source erase phase and shown in FIG. 1b will force the trapped charges on the floating gate 30 of the flash EEPROM cell 10 to migrate to the end of the floating gate 30 immediately above the source region 16. The electric field in the tunneling oxide 36 will force these trapped electrons to flow through the tunneling oxide-36 by the Fowler-Nordheim tunneling into the source region 16. At the completion of the phase 3 170 there will be positive charges 38 remaining in the tunneling oxide 36 as described above. Additionally there will be electrons 42 that have been trapped in the tunneling oxide 36 and at the surface states 40, again as described above.

During the channel erase cycle (phase 1), the relatively large negative voltage (−10 V) present at the control gate can range in magnitude from −5.0 V to −15.0 V. The first moderately large positive voltage (+5 V) present at the source at this time can range from 0.5 V to the value of the power supply voltage source generally 5.0 V. During the source erase phase (phase 3), the relatively large negative voltage (−10 V) can again have a range of from −5.0 V to −15.0 V and the second moderately large (+5 V) created by the p-well voltage generator Vpw that is present at the p-well can have a range of +0.5 V to that of the power supply voltage source generally +5.0 V.

The relative period of time for the phase 1 150, phase 2 160 and phase 3 170 of the erase cycle is approximately 50 msec. in duration. These cycles can range up to 1 Sec. in length.

Refer now to FIG. 1b for a description of the physical basis for the channel erase phase of the erase cycle of the flash EEPROM of this invention. As above described, during the channel erase phase (phase 1), the gate control voltage generator VG is set to the second relatively large negative voltage (−10 V). Since the gate control voltage generator VG is connected through the terminal 26 to the control gate 28, the control gate 28 will be set to the second relatively large negative voltage (−10 V). The drain 14 and the n-well 47 will be disconnected from their respective voltage generators and allowed to be floating. The voltage of the substrate voltage generator Vsub and the p-well voltage generator Vpw will be set to the ground reference potential (0 V) which will be respectively connected through terminal 20 to the p-type substrate 12 and through terminal 44 to the p-well 45. The source voltage generator VS and thus the source will be set to the second moderately large voltage (5 V).

The voltages as described will set up an electric field in the gate dielectric or tunneling oxide 36. Those electrons 42 trapped in the tunneling oxide 36 will be forced to be dissipated in the p-type substrate while the positive charges 38 will be attracted to the floating gate 32 thus eliminating any residual charges from the floating gate 32 or trapped charges 42 from the tunneling oxide 36.

This process will insure that the erased threshold voltage for the flash EEPROM cell 10 will return to the low threshold voltage of a completely erased cell. The elimination of the trapped charges 42 will also allow the appropriate increase of the programmed threshold voltage to the high threshold voltage approximately (6 V) of a programmed cell.

Figure 6A:
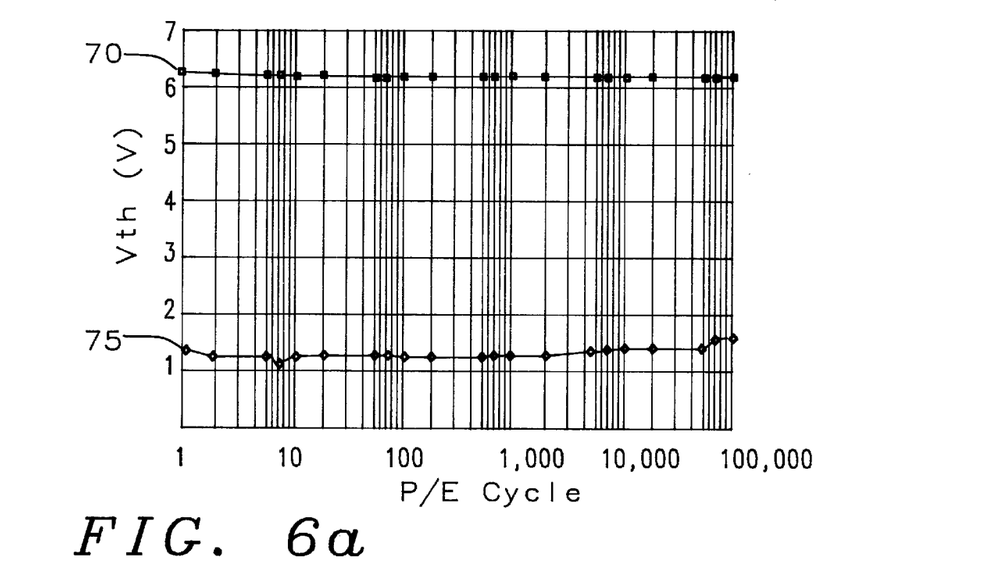
FIG. 6a is a plot of the threshold voltages versus the number of programming and erasing cycles using the erase cycle of this invention as shown in FIG. 5.

As is shown in FIG. 6, the programmed threshold voltage 70 will remain at a relatively constant value of greater than 6 V for at least 1000,000 programming/erase cycles. Also, as can be seen, the erased threshold voltage 75 will remain at a constant value of somewhat more than 1.0 V and degrading by less than 0.5 V for the 100,000 programming/erase cycles. By not degrading the threshold as seen in FIG. 3a, the flash EEPROM cell 10 of FIG. 1b and the flash EEPROM array 110 of FIG. 4 will maintain operation without failure for programming/erase cycle in excess of 100,000 cycles.

Figure 6B:
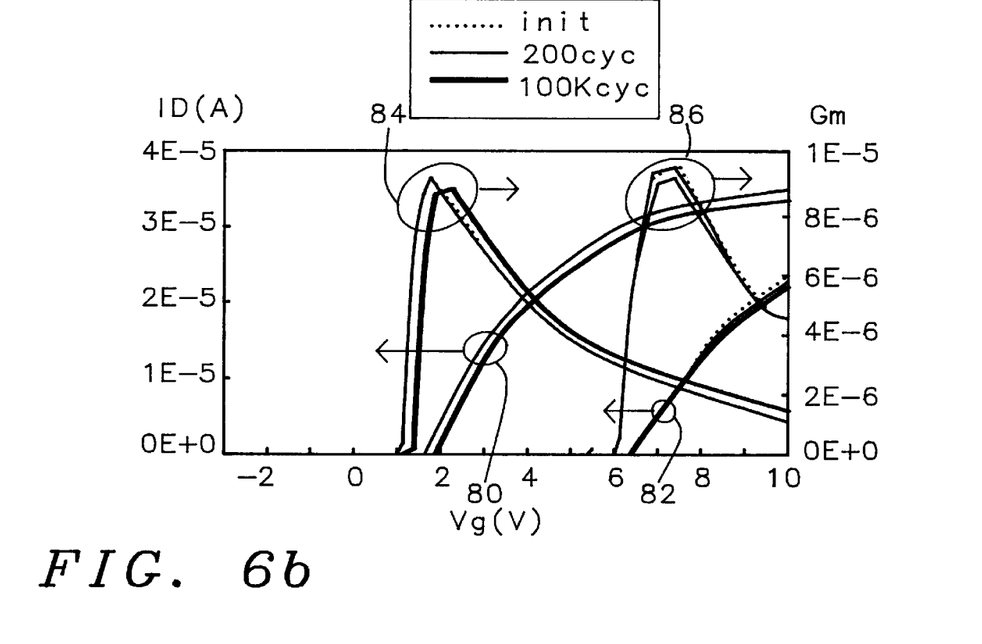
FIG. 6b is plot of the drain current $I_d$ and transconductance $G_m$ versus control gate voltage $V_g$ for an EEPROM cell employing the erase cycle of this invention.

Another illustration of the elimination of the trapped charges using the erasure cycle of this invention can be seen in the FIG. 6b. The set of curves 80 is and 82 show the response of the drain current $I_d$ versus the control gate voltage $V_g$. The set of curves 80 shows the drain current $I_d$ for an erased cell and the set of curves 82 are for a programmed cell. The plots illustrate that the drain current varies little over 100K program/erase cycles.

The set of curves 84 and 86 show the response of the transconductance $G_m$ versus the-control gate voltage $V_g$. The set of curves 84 shows the transconductance $G_m$ for an erased cell and the set of curves 86 are for a programmed cell. The plots illustrate that the transconductance $G_m$ varies little over 100K program/erase cycles.

While this invention has been particularly shown and described with reference to the preferred embodiments thereof, it will be understood by those skilled in the art that various changes in form and details may be made without departing from the spirit and scope of the invention.

What is claimed is:

1. A method to erase a flash EEPROM cell, which is comprised of a source and a drain diffused within a first well of a first conductivity type which is diffused into a second well of a second conductivity type which is further diffused in to a semiconductor substrate of the first conductivity type, and a control gate, a floating gate, and a tunneling oxide disposed upon the semiconductor substrate, to improve a write/erase threshold voltage closure from repeatedly writing and erasing said flash EEPROM cell, comprising the steps of:

a) channel erasing to remove charges trapped in said tunneling oxide of said flash EEPROM cell by the steps of:
   floating said drain and said second well,
   concurrently applying the ground reference potential to said semiconductor substrate and said first well,
   concurrently applying a second relatively large negative voltage pulse to said control gate, and
   concurrently applying a second moderately large positive voltage pulse to said source; and then
b) source erasing to remove charges from the floating gate of said flash EEPROM cell by the steps of,
   applying a first relatively large negative voltage pulse to the control gate of said EEPROM cell,
   concurrently applying a first moderately large positive voltage pulse to said first well,
   concurrently applying a ground reference potential to the semiconductor substrate,
   concurrently floating said drain.

2. The method to erase a flash EEPROM cell of claim 1 wherein source erasing the flash EEPROM removes charges from the floating gate.

3. The method to erase a flash EEPROM cell of claim 1 wherein channel erasing to detrap the flash EEPROM removes charges trapped in the tunneling oxide between the floating gate and the semiconductor substrate.

4. The method to erase a flash EEPROM cell of claim 3 wherein detrapping the flash EEPROM allows a separation of a programmed threshold voltage from an erased threshold voltage to be maintained over the repeated writing and erasing of said flash EEPROM, thus improving said write/erase threshold voltage closure.

5. The method to erase a flash EEPROM cell of claim 1 wherein the first moderately large positive voltage pulse has a voltage of approximately 5.0 V.

6. The method to erase a flash EEPROM cell of claim 1 wherein the first relatively large negative voltage pulse has a voltage of approximately −10 V.

7. The method to erase a flash EEPROM cell of claim 1 wherein the second moderately large positive voltage pulse has a voltage of approximately 5.0 V.

8. The method to erase a flash EEPROM cell of claim 1 wherein the second relatively large negative voltage pulse has a voltage of approximately −12 V.

9. The method to erase a flash EEPROM cell of claim 1 wherein the first moderately large positive voltage pulse, the first relatively large negative voltage pulse, second moderately large positive voltage pulse, and the second relatively large negative voltage pulse each have a duration of approximately 50m seconds.

10. A non-volatile semiconductor memory device comprising:
   a) a semiconductor substrate of a first conductivity type;
   b) a first diffusion well of a second conductivity type diffused into said semiconductor substrate;
   c) a second diffusion well of the first conductivity type diffused into said first diffusion well
   d) a pair of diffusions of a second conductivity type spaced distally from one another to form a source region and a drain region within said second diffusion well;
   e) a tunneling oxide insulation disposed upon said semiconductor substrate in a region generally between the source region and drain region in correspondence with a channel region and having a thickness which allows tunneling of carriers there through;
   f) a floating gate electrode disposed upon said tunneling oxide insulation generally in correspondence with said channel region;
   g) an inter-poly dielectric insulation disposed upon said floating gate electrode to insulate said floating gate;
   h) a control gate electrode disposed upon said inter-poly dielectric insulation generally aligned with said floating gate; and
   i) an erasing means to remove electrical charges from said floating gate electrode and to detrap trapped electrical charges from said tunneling oxide insulation to improve a separation factor of a programmed threshold voltage and an erased threshold voltage of said non-volatile semiconductor memory device wherein said electrical charges trapped in the tunneling oxide are detrapped by the steps of:
   floating said source, drain, and first diffusion well,
   coupling the ground reference potential to said semiconductor substrate and second diffusion well,
   simultaneously coupling a third voltage source to apply a second relatively large negative voltage pulse to said control gate, and
   simultaneously coupling a fourth voltage source to the source to apply a second moderately large positive voltage to said source,
   and wherein said charges are removed from the floating gate subsequent to said removal of trapped charges by the steps of:
   coupling a first source to the first diffusion well to apply a first moderately large positive voltage pulse to the second diffusion well,
   simultaneously coupling a second voltage source to the control gate to apply a first relatively large negative voltage to the control gate,
   simultaneously coupling the ground reference potential to the semiconductor substrate, and simultaneously floating said drain and said first diffusion well.

11. The non-volatile semiconductor memory device of claim 10 wherein the first moderately large voltage pulse has a voltage of approximately 5.0 V.

12. The non-volatile semiconductor memory device of claim 10 wherein the first relatively large negative voltage pulse has a voltage of approximately −10 V.

13. The non-volatile semiconductor memory device of claim 10 wherein the second moderately large voltage pulse has a voltage of approximately 5.0 V.

14. The non-volatile semiconductor memory device of claim 10 wherein the second relatively large negative voltage pulse has a voltage of approximately −10 V.

15. The non-volatile semiconductor memory device of claim 10 wherein the first moderately large positive voltage pulse, the first relatively large negative voltage pulse, first moderately large positive voltage pulse, and the second relatively large negative voltage pulse each have a duration of approximately 50m seconds.

16. A non-volatile semiconductor memory device comprising:
   a) a semiconductor substrate of a first conductivity type;
   b) a first diffusion well of a second conductivity type diffused into said semiconductor substrate,
   c) a second diffusion well of the first conductivity type diffused into said first diffusion well
   d) a plurality of memory cells arranged in an array wherein each cell comprises:
   a pair of diffusions of a second conductivity type spaced distally from one another to form a source region and a drain region within said second diffusion well, a tunneling oxide insulation disposed upon said semiconductor substrate in a region generally between the source region and drain region in correspondence with a channel region and having a thickness which allows tunneling of carriers there through, a floating gate electrode disposed upon said tunneling oxide insulation generally in correspondence with said channel region, an inter-poly dielectric insulation disposed upon said floating gate electrode to insulate said floating gate, and a control gate electrode disposed upon said inter-poly dielectric insulation generally aligned with said floating gate; and e) an erasing means to remove electrical charges from said floating gate electrode and to detrap trapped electrical charges from said tunneling oxide insulation to improve a separation factor of a programmed threshold voltage and an erased threshold voltage of said non-volatile semiconductor memory device wherein said electrical charges trapped in the tunneling oxide are detrapped by the steps of floating said source, drain, and first diffusion well, coupling the ground reference potential to said semiconductor substrate and second diffusion well, simultaneously coupling a third voltage source to apply a second relatively large negative voltage pulse to said control gate, and simultaneously coupling a fourth voltage source to the source to apply a second moderately large positive voltage to said source, and wherein charges are removed from the floating gate subsequent to the removal of the charges trapped in the tunneling oxide by the steps of:

coupling a first source to the first diffusion well to apply a first moderately large positive voltage pulse to the second diffusion well, simultaneously coupling a second voltage source to the control gate to apply a first relatively large negative voltage to the control gate, simultaneously coupling the ground reference potential to the semiconductor substrate, and simultaneously floating said drain and said first diffusion well.

17. The non-volatile semiconductor memory device of claim 16 wherein the first moderately high positive voltage pulse has a voltage of approximately 5.0 V.

18. The non-volatile semiconductor memory device of claim 16 wherein the first relatively high negative voltage pulse has a voltage of approximately -10 V.

19. The non-volatile semiconductor memory device of claim 16 wherein the second moderately high positive voltage pulse has a voltage of approximately 5.0 V.

20. The non-volatile semiconductor memory device of claim 16 wherein the second relatively large negative voltage pulse has a voltage of approximately -10 V.

21. The non-volatile semiconductor memory device of claim 16 wherein the first moderately large positive voltage pulse, the first relatively large negative voltage pulse, first moderately large positive voltage pulse, and the second relatively large negative voltage pulse each have a duration of approximately 50 m seconds.

22. An erasing circuit to remove charges and to detrap charges from flash EEPROM cells, a source and a drain diffused within a first well of a first conductivity type which is diffused into a second well of a second conductivity type which is further diffused in to a semiconductor substrate of the first conductivity type, and a control gate, a floating gate, and a tunneling oxide disposed upon the semiconductor substrate, comprising:

a) a first voltage source coupled to the control gate;

b) a second voltage source coupled to the source region;

c) a third voltage source coupled to the drain region;

d) a fourth voltage source coupled to the semiconductor substrate;

e) a fifth voltage source coupled to the first well;

f) a sixth voltage source coupled to the second well g) an erasing control means coupled to the first, second, third, and fourth voltage sources to control said first, second, third, and fourth voltage sources, wherein a channel erasing to detrap said charges from the tunneling oxide is accomplished by the steps of:

disconnecting said third and sixth voltage sources respectively from the drain and the second well to float said drain and second well, simultaneously forcing said fourth and fifth voltage source to apply the ground reference potential to said semiconductor substrate and to said first well, simultaneously forcing said first voltage source to apply a second relatively large negative voltage pulse to said control gate, and simultaneously forcing said second voltage source to apply a second moderately large positive voltage pulse to said source gate, and wherein a source erasing to remove charges from said floating gate subsequent to said detrapping is accomplished by:

forcing said first voltage source to apply a first relatively large negative voltage pulse to the control gate of said EEPROM cell, simultaneously disconnecting said second voltage source to float the source of said EEPROM cell, simultaneously disconnecting said third voltage source to float the drain of said EEPROM cell, simultaneously disconnecting said sixth voltage source to float the first well, simultaneously forcing the fourth voltage sources to a ground reference potential to apply the ground reference potential to the semiconductor substrate and forcing said fifth voltage source to apply a first moderately large positive voltage pulse to the second well.

* * * * *